United States Patent
Salmela et al.

(10) Patent No.: US 6,921,868 B2
(45) Date of Patent: Jul. 26, 2005

(54) TRIMMING OF EMBEDDED STRUCTURES

(75) Inventors: Olli Salmela, Helsinki (FI); Iipo Kokkonen, Oulu (FI)

(73) Assignee: Nokia Corporation, Espoo (FI)

( * ) Notice: Subject to any disclaimer, the term of this patent is extended or adjusted under 35 U.S.C. 154(b) by 32 days.

(21) Appl. No.: 10/297,762

(22) PCT Filed: Apr. 27, 2001

(86) PCT No.: PCT/FI01/00411

§ 371 (c)(1),
(2), (4) Date: Dec. 9, 2002

(87) PCT Pub. No.: WO01/95684

PCT Pub. Date: Dec. 13, 2001

(65) Prior Publication Data

US 2003/0161121 A1 Aug. 28, 2003

(30) Foreign Application Priority Data

Jun. 9, 2000 (FI) .............................. 20001384

(51) Int. Cl.⁷ ................................................ H05K 1/03
(52) U.S. Cl. ..................... 174/255; 174/260; 361/761; 29/846; 29/852
(58) Field of Search ................................ 174/260, 254; 361/761–764; 29/846, 847, 852, 853

(56) References Cited

U.S. PATENT DOCUMENTS

| | | | |
|---|---|---|---|
| 3,996,416 A | * 12/1976 | Lemke | .................... 174/261 |
| 4,792,779 A | 12/1988 | Pond et al. | |
| 4,859,806 A | * 8/1989 | Smith | .......................... 174/261 |
| 5,097,237 A | * 3/1992 | Komazaki et al. | .......... 333/204 |
| 5,140,497 A | * 8/1992 | Kato et al. | ............... 361/321.1 |
| 5,165,166 A | * 11/1992 | Carey | .......................... 29/847 |
| 6,134,117 A | * 10/2000 | Funk et al. | .................. 361/760 |
| 6,225,570 B1 | * 5/2001 | Ishiyama et al. | ........... 174/260 |
| 6,229,097 B1 | * 5/2001 | Suppelsa et al. | ............ 174/260 |
| 6,518,658 B2 | * 2/2003 | Yoshisato et al. | ........... 257/701 |
| 6,534,861 B1 | * 3/2003 | Castro | ........................ 257/734 |
| 6,664,481 B1 | * 12/2003 | Olofsson | .................... 174/260 |

FOREIGN PATENT DOCUMENTS

| | | |
|---|---|---|
| EP | 0 926 932 A2 | 6/1999 |
| FI | 78797 | 10/1983 |
| FI | 97261 | 5/1990 |

OTHER PUBLICATIONS

Abstract of JP 6165465 A, Toshiba Corp., Apr. 4, 1986.

* cited by examiner

Primary Examiner—Kamand Cuneo
Assistant Examiner—Jeremy Norris
(74) Attorney, Agent, or Firm—Squire, Sanders & Dempsey L.L.P.

(57) ABSTRACT

A cavity is formed in a multilayer substrate at the point of the structure to be trimmed. This enables the embedding of tolerance critical components inside substrates, such as printed circuit boards, modules, and sub-systems. Trimming is done through the cavity using, for example, a laser. After trimming the cavity is easy to fill in with a suitable dielectric material or to cover otherwise, e.g. by using a lid, or to leave the cavity uncovered.

14 Claims, 2 Drawing Sheets

TRIMMING OF EMBEDDED STRUCTURES

FIELD OF THE INVENTION

This invention relates to trimming of structures and components in electric circuits. The invention can, for example, be utilized in multilayer ceramics technologies, in organic printed circuit boards, and in micro-electro-mechanical systems.

BACKGROUND OF THE INVENTION

The trimming of electrical structures, such as filters, resonators, and passive components, is required in order to get the system to work in the designed way. This is due to the fact that manufacturing processes may lack the required accuracy that is needed to gain the nominal values used in the design phase. Also, statistical variation within the manufacturing process of printed circuit boards, discrete components, or integrated circuits may create the need for trimming some critical parts or points. In this content trimming means cutting a structure or a component, for example by laser, until the desired electrical characteristics are achieved.

The problem so far, has been that trimming has been possible only if the component or the structure has been located on the surface of the whole structure. In other words, trimming has been possible on the surface layer. The apparatus used for trimming, such as lasers, can not penetrate through printed circuit boards. Due to this all tolerance critical parts have been placed on the top layer, which causes large circuit modules that are expensive. Structures on the surface must also be covered with a protection layer, such as an over-glaze material. This is an additional process step, increasing the cost of the structure.

Furthermore, conductor materials used on top layers must be resistive to electro-migration. (Surface layers are sensitive to electro-migration, which causes changes in electrical behavior.) For example, in multilayer ceramics technologies Ag-Pd paste material has to be used on a top layer instead of pure Ag paste for preventing unwanted migration effects. Using Ag-Pd paste instead of Ag paste results in higher conductor losses. That degrades, for example, the Q values of resonators and increases insertion loss in filter structures.

The objective of the invention is to eliminate the above-mentioned drawbacks of known solutions. This is achieved in a way described in the claims.

SUMMARY OF THE INVENTION

The idea of the invention is to form a cavity in a multilayer substrate at the point of the structure to be trimmed. This enables the embedding of tolerance critical components inside substrates, such as printed circuit boards, modules, and sub-systems. Trimming is done through the cavity using, for example, a laser. After trimming the cavity is easy to fill in with a suitable dielectric material, or to cover otherwise, e.g. by using a lid, or to leave the cavity uncovered. The invention makes it possible to insert tolerance critical structures and components into a substrate.

BRIEF DESCRIPTION OF THE DRAWINGS

In the following the invention is described in more detail by means of the attached figures, of which

DETAILED DESCRIPTION OF THE INVENTION

Figure 1:
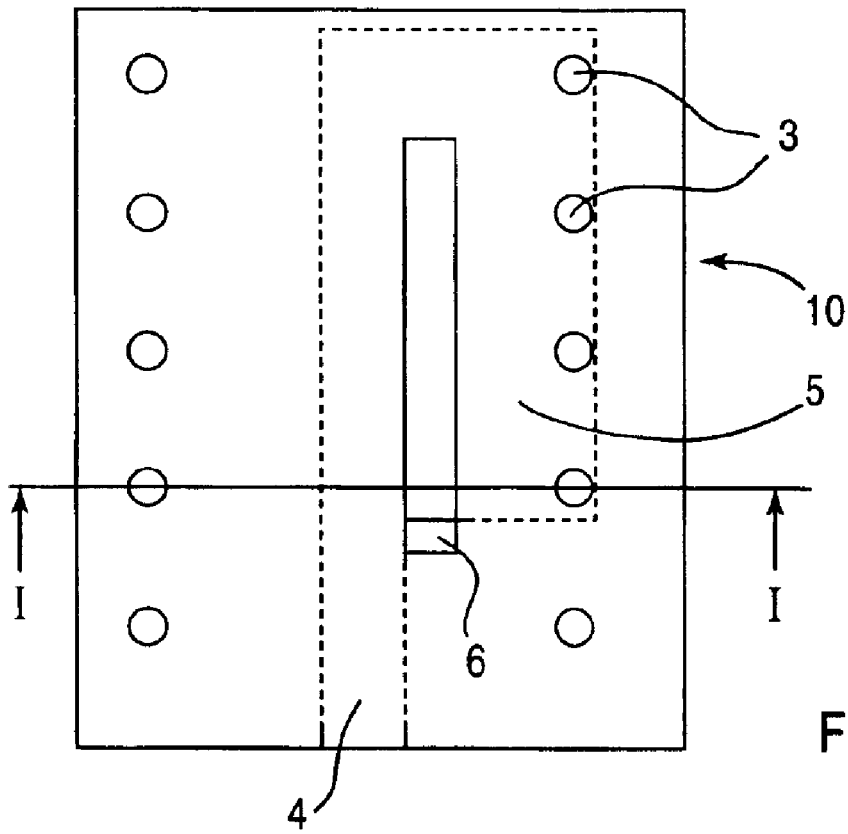
FIG. 1 illustrates an example of the the top view of an embedded resonator.
Figure 2:
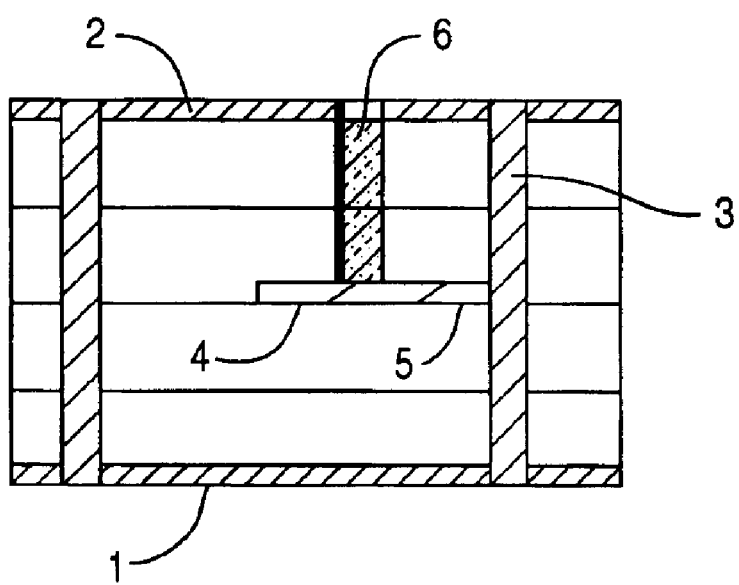
FIG. 2 is a cross-sectional view of the resonator in FIG. 1 taken along line I—I.

FIG. 1 depicts the top view of an example of an embedded resonator inside a multilayer circuit board (10) and FIG. 2 a cross section of FIG. 1. The surface of the resonator, forming a ground line, is fabricated from conductive materials, for example, so that the bottom (1) and the top (2) edges are conductive strip lines, and the sides are conductive via posts (3). In the center of the resonator there is a conductive strip line (4) forming a signal line, which is connected to the surface of the resonator via an extension (5) forming a short circuit between the signal line and the ground line. The structure includes also a cavity (6) that partially discloses the short circuit between the signal and ground lines.

It can be seen that the resonator length, i.e. the location of the short circuit, can be easily trimmed, for example, with a laser by pointing the laser through the cavity towards the printed circuit board and by cutting the short circuit extension between the signal line and the ground line until the desired length is reached.

Figure 3:
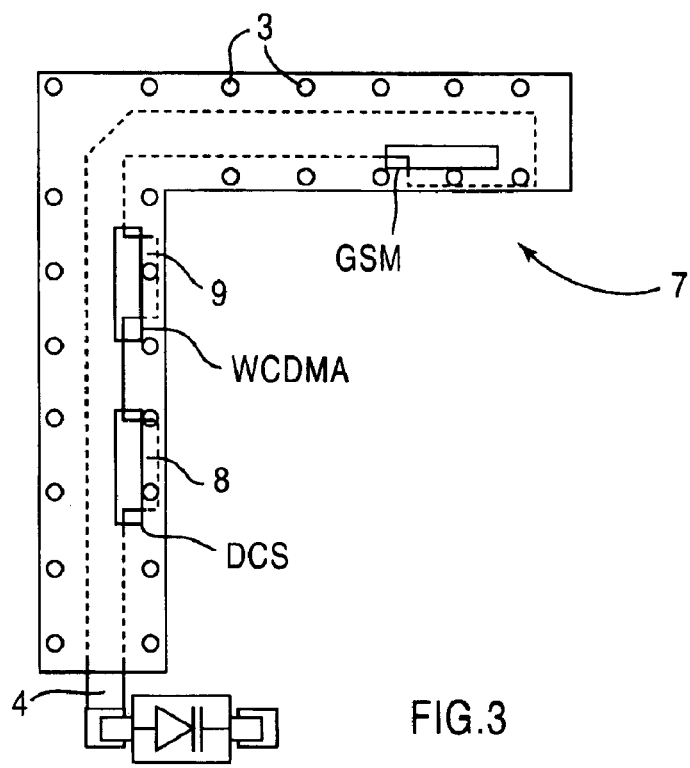
FIG. 3 illustrates an example of an embedded multiband module resonator.

FIG. 3 depicts an example of an embedded module multiband resonator (7), which can be used in a desired frequency area (DCS, WCDMA, or GSM). In this case it is possible to separate the signal and the ground line totally from each other at the points of the cavities. In other words, it is possible to separate parts of the circuitry. There are several trimming cavities (DCS, WCDMA, GSM) in the printed circuit board. Trimming is done so that the choice of the frequency area is done by cutting short circuit extensions open through cavities in higher frequency areas and fine tuning is done through the cavity in the desired frequency area. If the resonator is planned to be used in a DCS (Digital Cellular System)-area, the fine tuning is done through the DCS cavity by cutting a suitable length of the extension away until the desired value is achieved. If the resonator is planned to be used in a WCDMA (wideband code-division multiple access) area, the fine tuning is done through the WCDMA cavity, and if the resonator is planned to be used in a GSM area, the fine tuning is done through the GSM (Global System for Mobile Communication) cavity.

For example, the resonator (7) can be trimmed to the WCDMA area when the short circuit extension (8) in the DCS area is cut totally open by a laser through the first cavity (DCS) and the fine tuning is done by cutting the desired length of the short circuit extension (9) open through the second cavity (WCDMA). In this case there is no need to use the third cavity (GSM) but in the case of using the resonator in a GSM area, the short circuit extensions (8,9) are cut totally open through the first and the second cavity, and the fine tuning is done through the third cavity. So it is possible to use one module structure in different frequency areas. The number of trimming cavities depends on the case.

Similar structures can be used in order to suppress spurious harmonics. Both before-mentioned structures can be used, for example, in voltage-controlled oscillators.

Figure 4:
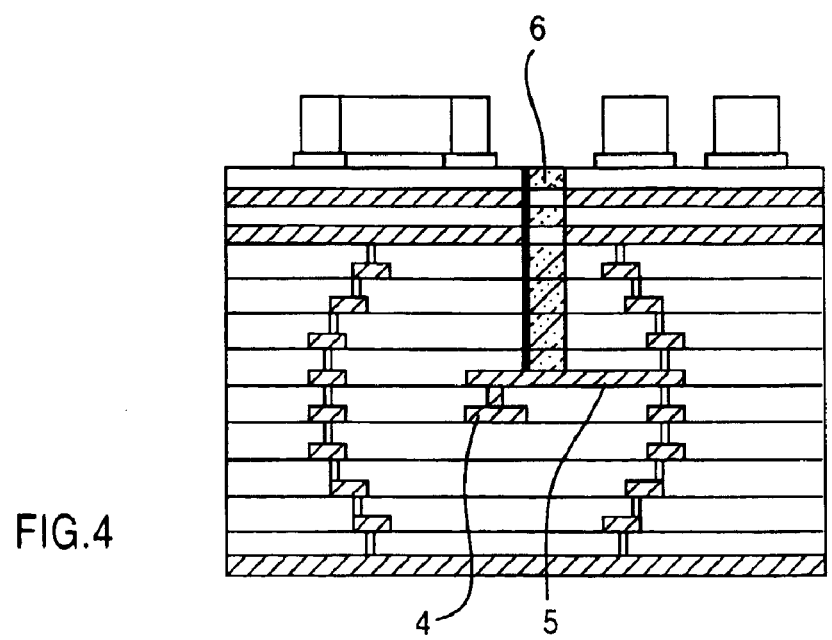
FIG. 4 illustrates an example of an embedded coaxial resonator.

In the example of FIG. 4 the transmission line used is a multilayer coaxial line. From the figure it can be clearly noted that a large amount of surface area can be saved, and discrete components can be placed on the top of the resonator structure.

The invention enables the trimming of tolerance critical components inside printed circuit boards, modules, and sub-systems. This means savings of printed circuit board area and costs. Enhanced electrical performance can also be reached because higher conductive conductor materials can be used. Embedded structures are well EMC shielded and isolation is better than in conventionally trimmed structures.

There exist several other options than above-mentioned to use the invention as well. Also, the purpose of transmission line trimming can be different than to remove or move the termination of the line. It can, for example, be used to change transmission line properties of the signal line by changing the width of the conductors. So it is evident that the invention is not restricted to the before-mentioned examples, but it can be used in other solutions within the scope of the inventive idea.

What is claimed is:

1. A method of trimming an embedded conductive element, the method comprising the steps of:
   (a) embedding a conductive element within a substrate, said conductive element having at least one extension connecting said conductive element to a further part of a circuitry;
   (b) forming at least one cavity in the substrate from a surface of the substrate to at least one of said at least one extension of the conductive element herein;
   (c) providing a trimming device;
   (d) inserting the trimming device through the at least one cavity toward the embedded conductive element;
   (e) trimming the element through at least one cavity by cutting at least part of at least one of said at least one extension, and
   (f) filling the at least one cavity after trimming with at least one of a dielectric material and a resistive material.

2. A multilayer substrate comprising:
   a first surface;
   a second surface disposed opposite the first surface;
   at least one transverse element connecting the first and second surfaces;
   a substrate disposed between the first and second surfaces;
   a conductive element to be trimmed disposed within the substrate;
   at least one extension connecting the conductive element to the at least one transverse element,
   wherein at least one cavity is disposed in the substrate between the first surface and at least one of said at least one extension connected to the conductive element, and wherein the substrate is configured whereby the conductive element is trimmed through the cavity by cutting at least part of at least one of said at least one extension by a trimming element.

3. The multilayer substrate according to claim 2, wherein the multilayer substrate comprises a printed circuit board.

4. The multilayer substrate according to claim 2, wherein the at least one transverse element comprises a conductive material.

5. The multilayer substrate according to claim 2, wherein the substrate comprises a plurality of substrate layers.

6. The multilayer substrate according to claim 5, wherein the plurality of substrate layers contains several conductive elements to be trimmed.

7. The multilayer substrate according to claim 2, wherein said conductive element is included in a resonator.

8. The multilayer substrate according to claim 2, wherein said conductive element is included in a multiband resonator.

9. The multilayer substrate according to claim 2, wherein said conductive element is included in a filter.

10. The multilayer substrate according to claim 2, wherein said conductive element is included in a transmission line.

11. A method of manufacturing a multilayer substrate, the method comprising the steps of:
    (a) providing a first surface and a second surface opposite the first surface;
    (b) providing at least one connecting element connecting the first surface and the second surface;
    (c) layering a plurality of substrates between the first and second surfaces;
    (d) embedding a conductive element within the plurality of substrates;
    (e) providing at least one extension between the conductive element and the at least one connecting element;
    (f) forming at least one cavity in the plurality of substrates from the first surface to at least one of said at least one extensions of the conductive element; and
    wherein the at least one cavity provides access for a trimming device to trim the conductive element by cutting at least part of at least one of said at least one extension.

12. The method according to claim 11, wherein the step of embedding a conductive element within the plurality of substrates comprises embedding a resonator within the plurality of substrates.

13. The method according to claim 11, wherein the step of embedding a conductive element within the plurality of substrates comprises embedding a multiband resonator within a plurality of substrates.

14. A multilayer substrate comprising:
    a first surface and a second surface opposite the first surface;
    first conducting means for conducting electricity between the first and second surfaces;
    a plurality of substrate layers inserted between the first and second surfaces;
    second conducting means for conducting electricity, disposed within the plurality substrate layers;
    at least one extension connecting the second conducting means to the first conducting means,
    wherein at least one cavity is formed in the plurality of substrate layers between the first surface and the second conducting means, and wherein the second conducting means is configured whereby a trimming device trims the second conducting means through the cavity by cutting at least part of at least one of said at least one extension.

* * * * *